(12) United States Patent  
Stadelmayer et al.

(10) Patent No.: US 6,496,025 B1
(45) Date of Patent: Dec. 17, 2002

(54) METHOD AND APPARATUS FOR TESTING PRINTED CIRCUIT BOARD ASSEMBLIES

(75) Inventors: Friedrich Stadelmayer, Victorville; T. Edward States, Hesperia; John Soenderby, Upland; Francesco Sacca, Rialto, all of CA (US)

(73) Assignee: GTE Communication Systems Corporation, Irving, TX (US)

( * ) Notice: Subject to any disclaimer, the term of this patent is extended or adjusted under 35 U.S.C. 154(b) by 0 days.

(21) Appl. No.: 09/209,334

(22) Filed: Dec. 11, 1998

(51) Int. Cl.[7] .............................................. G01R 31/02
(52) U.S. Cl. .................................... 324/761; 324/158.1
(58) Field of Search ................................ 324/760, 761, 324/158.1, 765, 73.1, 754; 361/798, 797, 752, 683

(56) References Cited

U.S. PATENT DOCUMENTS

| | | | | |
|---|---|---|---|---|
| 3,271,626 A | * | 9/1966 | Howrilka | 361/798 |
| 3,656,058 A | * | 4/1972 | Leathers | 324/760 |
| 4,145,620 A | * | 3/1979 | Dice | 307/149 |
| 4,542,341 A | * | 9/1985 | Santomango et al. | 324/760 |
| 4,695,707 A | * | 9/1987 | Young | 324/158.1 |
| 4,758,780 A | * | 7/1988 | Coon et al. | 324/73.1 |
| 4,888,549 A | * | 12/1989 | Wilson et al. | 324/73.1 |
| 5,031,074 A | * | 7/1991 | Ravid | 361/683 |
| 5,055,779 A | * | 10/1991 | Kerschner et al. | 324/754 |
| 5,268,637 A | * | 12/1993 | Liken et al. | 324/158.1 |
| 5,327,075 A | * | 7/1994 | Hashinaga et al. | 324/158.1 |
| 5,543,727 A | * | 8/1996 | Bushard et al. | 324/760 |
| 6,100,706 A | * | 8/2000 | Hamilton et al. | 324/760 |

* cited by examiner

Primary Examiner—Michael J. Sherry
Assistant Examiner—Minh N. Tang
(74) Attorney, Agent, or Firm—Leonard Charles Suchyta; James K. Weixel

(57) ABSTRACT

Printed circuit board assemblies must be tested before being sold to consumers. Yet, the assemblies have various shapes and input/output configurations. Thus, a need exists for a general apparatus and method for testing a variety of assemblies. The present tester uses a test enclosure which contains the necessary test electronics. The front of the enclosure includes a personality board which is designed to interface with the device under test.

30 Claims, 6 Drawing Sheets

METHOD AND APPARATUS FOR TESTING PRINTED CIRCUIT BOARD ASSEMBLIES

BACKGROUND OF THE INVENTION

1. Technical Field

The present invention relates to both a method and an apparatus for testing the functionality of printed circuit board assemblies. More specifically, the invention relates to an apparatus that can be easily configured to test a wide variety of assemblies.

2. Description of the Related Art

One of the most important issues for makers of printed circuit board assemblies is the cost of testing each assembly to ensure it functions properly. In view of the increasingly lowered cost of producing the assemblies, the cost of testing takes on greater significance. For example, it is common for the cost of testing a board's functionality to be 30% to 40% of the cost of the product. Thus, the cost of testing is a significant percentage of the overall cost of the product.

The cost of testing the functionality of printed circuit board assemblies impacts many industries. For example, most personal computers contain several printed circuit board assemblies. A standard computer will have a motherboard, a modem board, a video board, as well as others. One option is to simply not test the boards at all. However, this results in increased customer dissatisfaction due to non-functional products. Further, the cost of warranty repair increases. In other words, not testing merely shifts increased costs downstream in the product's life.

The problem arises with the number of different boards to be tested. Each assembly may be on a different sized board. A tester must be able to easily accommodate different sized boards. Next, the boards may have several input connections located at different positions on the board. A tester must be able to be flexible enough to mate with those inputs and be able to provide the correct standard connection. Finally, a successful tester must include the necessary test electronics to provide a routine set of inputs and detect the assembly's output. The tester must be able to compare the detected output against a list of expected outputs to determine if the assembly is functioning within expected parameters.

SUMMARY OF THE INVENTION

This invention allows the functionality of a variety of printed circuit board assemblies to be tested. The device under test is tested in a fashion that would match its actual function in the consumer's world. In other words, the device under test is powered up, multiple inputs provided and the outputs compared to set of expected outputs for compliance to determine if the device is passed or failed.

The apparatus includes two main elements, a test hardware enclosure and a test fixture. The test hardware enclosure, also referred to as the test enclosure, can be a commercially available enclosure that houses the test equipment. For example, the test equipment could include any mountable electronic equipment needed to run or monitor the test, such as a computer and peripherals, a digital volt meter, a digital logic analyzer, oscilloscopes, a network analyzer, a modem, a CRT, cameras, and pneumatic controls. The front panel of the enclosure is a personality board. Due to its modular nature, the personality board can also be referred to as the personality module. It is designed to interface with the device under test. The inwardly facing surface of the personality board is the system back plane, and connects the personality board to the test equipment in the housing. The outwardly facing surface of the personality board contains the several interface plugs that interconnect with the input/output leads for the device under test. The interfaces can also be referred to as the interface modules.

The test fixture is an assembly that mates with the hardware enclosure. It can be secured to the enclosure without the use of any tools. The test fixture can be altered with access modules, allowing the fixture to be quickly configured to any product. The device under test resides on a non-conductive pallet designed for that specific device under test. The pallet is placed on a drawer plate on the test fixture. Once the device under test is securely attached to the test fixture, the test fixture can engage the test enclosure. The device under test then engages the interface module on the personality board. The tester can be either manual, semi-automatic or automatic.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE DRAWINGS

Figure 1:
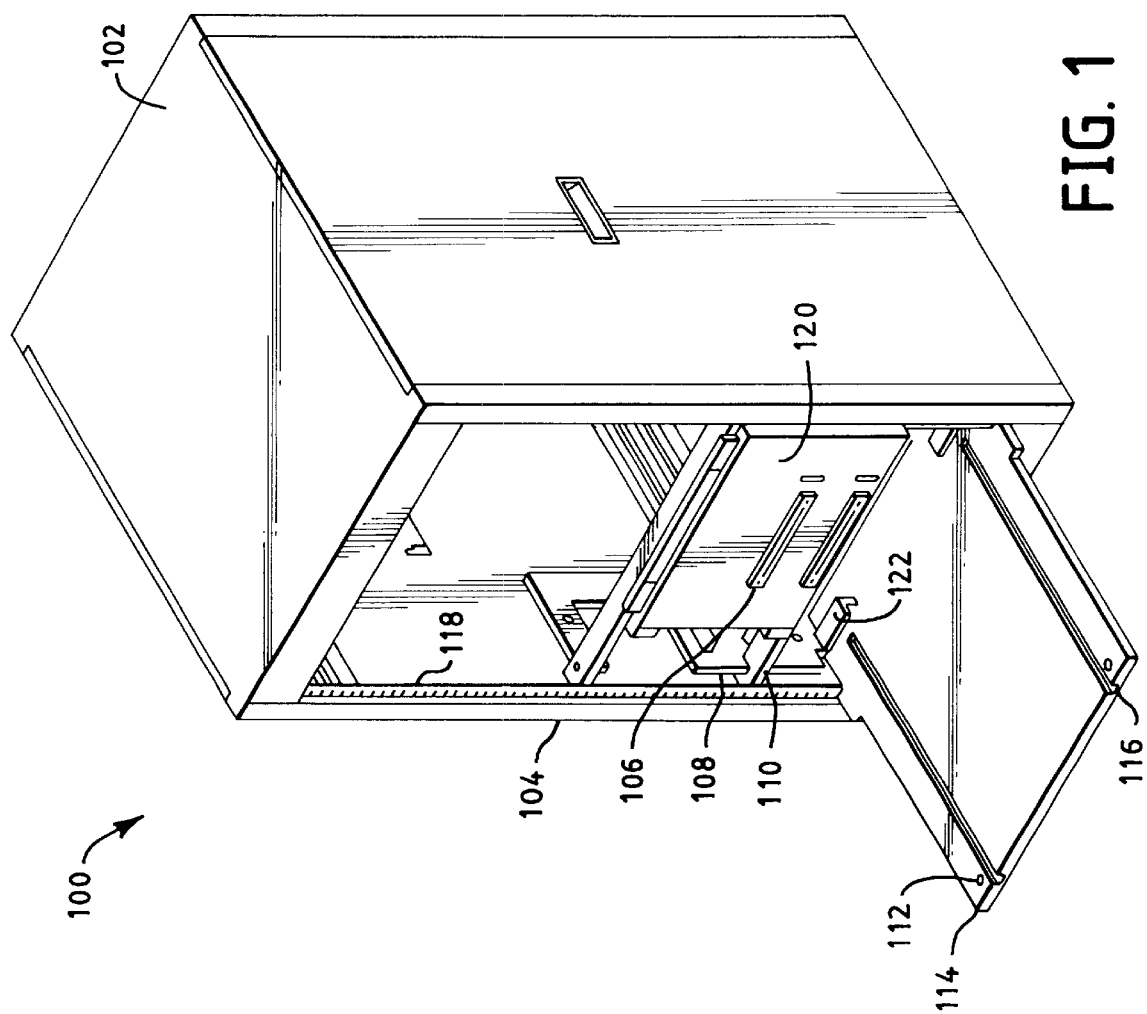
FIG. 1 is a perspective view of the test hardware enclosure used with one embodiment of the present invention.

FIG. 1 illustrates the test equipment enclosure 100 used in one embodiment of the present invention. The enclosure 100 comprises a generally hollow frame 102 having a front surface 104. Within the frame 102 are a plurality of slots and rails for accepting modular elements. For example, the frame might be a standard nineteen-inch rack. A base fixture 114 can be located generally near the base of the-enclosure 100. The base fixture can be engaged with slots 118 on the front surface 104. Vertical members 108 and mounting frame 110 can be used to mount the personality board 120. In turn, the personality board can have a variety of interfaces 106. The personality board 120 can also be referred to as the personality module 120. Likewise, the interfaces 106 can be referred to as the interface modules 106. This distinction is made because both can be easily replaced to accommodate a different device under test.

Within the enclosure resides any variety of prior art testers. The frame may also provide for ventilation slots, a power supply, a cooling fan, and so forth. The base fixture 114 is fixed to the enclosure 100 and does not move. On the upper surface of the base fixture is at least one alignment groove 116. As illustrated, four alignment grooves are used to guide a test fixture 200, as shown in FIG. 2.

The test fixture is placed on the base fixture and can slide forward until it reaches the mechanical stops 122 on the rear of the base fixture 114. In other words, the test fixture moves from a disengaged position to an engaged position. Once in the engaged position, locking plungers 112 can be rotated to lock the test fixture 200 in place relative to the base fixture 114.

Figure 2:
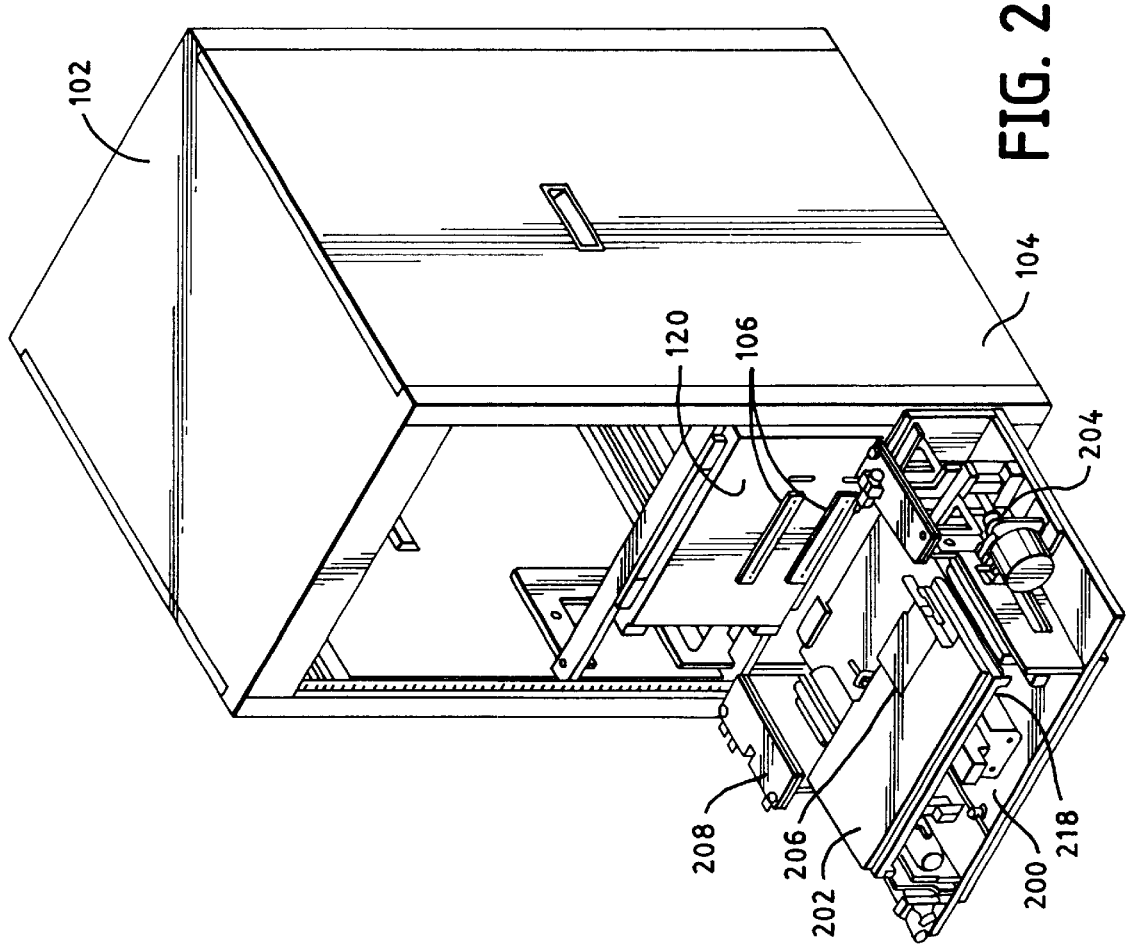
FIG. 2 is a perspective view of the test hardware enclosure along with the test fixture used to hold the device under test ("DUT")

Referring more specifically to FIG. 2, the test fixture 200 is shown in detail. The test fixture 200 includes a drawer assembly 218 that includes a pallet 202 on its upper surface. The drawer assembly can be moved by means of an actuator toward the interface modules 106. The pallet 202 is configured to match the needs of the particular device under test 206. In other words, the pallet 202 can vary in thickness, can include slots to better engage the device under test and so forth. The pallet 202 is non-conductive. As most printed circuit board assemblies have conductive leads on both sides, it is important not to establish a ground plane to the device under test. A non-conductive pallet 202 minimizes the risk of current being drained to the test fixture. The drawer assembly 218 has a moving plate just below the pallet 202. Once the pallet is in place, the drawer assembly 218 can be moved to engage the device under test with the interface modules.

The device under test is shown for illustration purposes only as a modem. A modem also includes a telephone port as an input/output port To properly test the modem, a standard plug must be inserted into that port. The present invention provides for that through the use of side access modules. The invention can use either a right side access module 204 and/or a left side access module 208. For manual operation, the side access module could be actuated by either a hand crank or a servomotor. For semiautomatic or fully automatic operation, a pneumatic cylinder or a servomotor can power the module. Once the device under test has engaged the interface modules 106, the side access module 204 can laterally engage the modem's port with a plug. That plug, in turn, is coupled to the test equipment within the enclosure.

Figure 3:
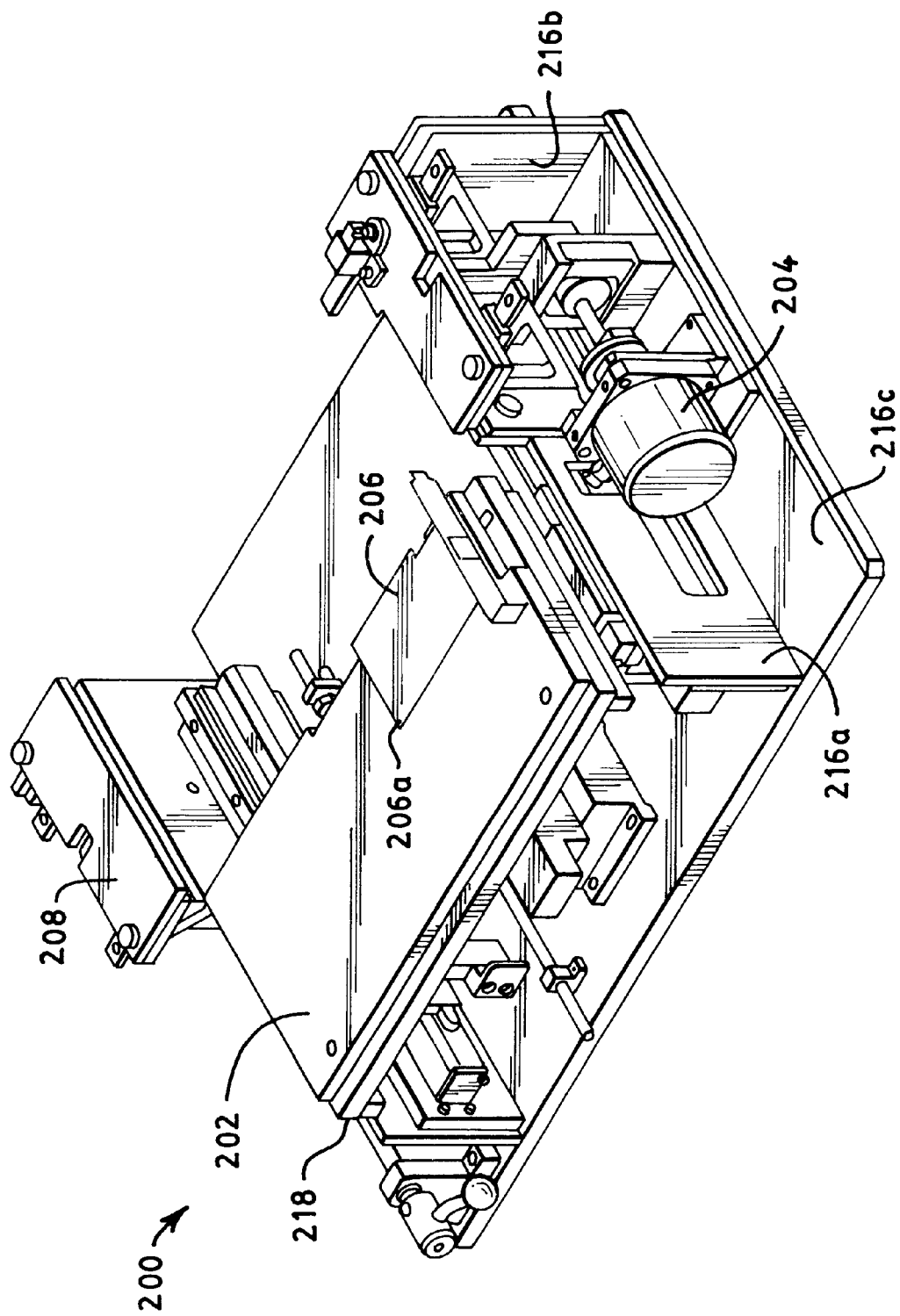
FIG. 3 is a detailed view of the test fixture shown in FIG. 2.
Figure 4:
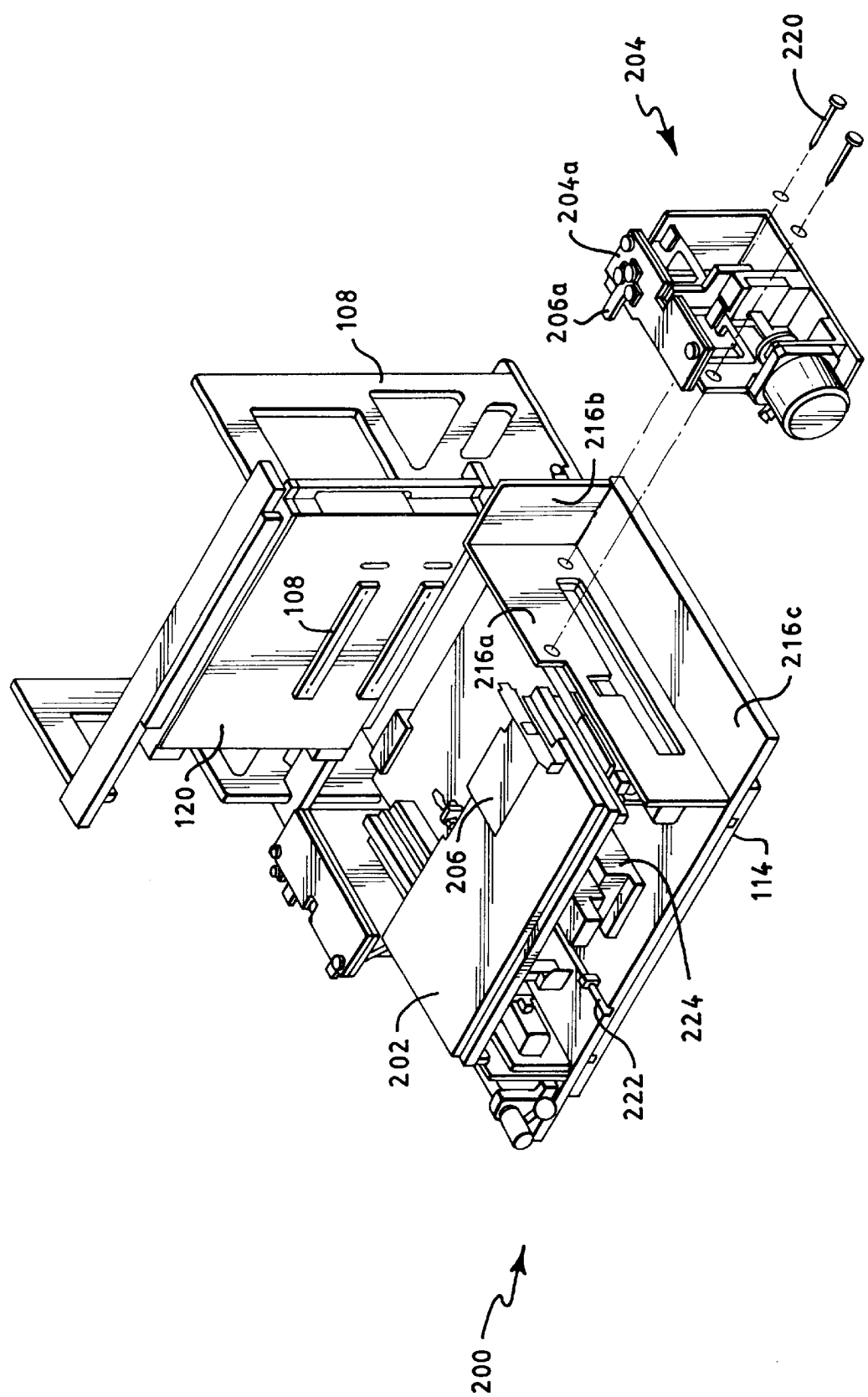
FIG. 4 provides additional views of the test fixture.

FIGS. 3 and 4 provide a more detailed view of the test fixture 200. The device under test 206 is placed on the pallet 202. Registration pins 206a can be used to positively register the device under test. The right access module 204 is illustrated as a pneumatic or a servo actuator. The side access modules can be easily substituted as the modules are coupled to the base fixture by removable fasteners 220. The test fixture 200 is formed by the base plate 216c, the side walls 216a, and the end plates 216b. The test fixture 200 is fixed with respect to the base fixture 114 once installed. The moving part of the system is the drawer assembly 218 that carries the pallet 202 and any device under test 206 into the interface module 106. When the drawer assembly 218 is engaged, then the side access modules 204, 208 can be engaged into the device under test 206. The side access modules 204, 208 are totally independent from the pallet 202 and drawer assembly 218. Slots in the side wall 216a are for cabling.

Plate 204a is a moving element on the side access module 204. A plug 206b or other test connection can be mounted on the plate 204a. An actuator moves the plate and thus the coupler into the device under test 206. The drawer release button 222 is used to release the drawer from the engaged position in the manual fixtures. For semi-automatic and automatic modes, the release button 222 could be removed.

Figure 5:
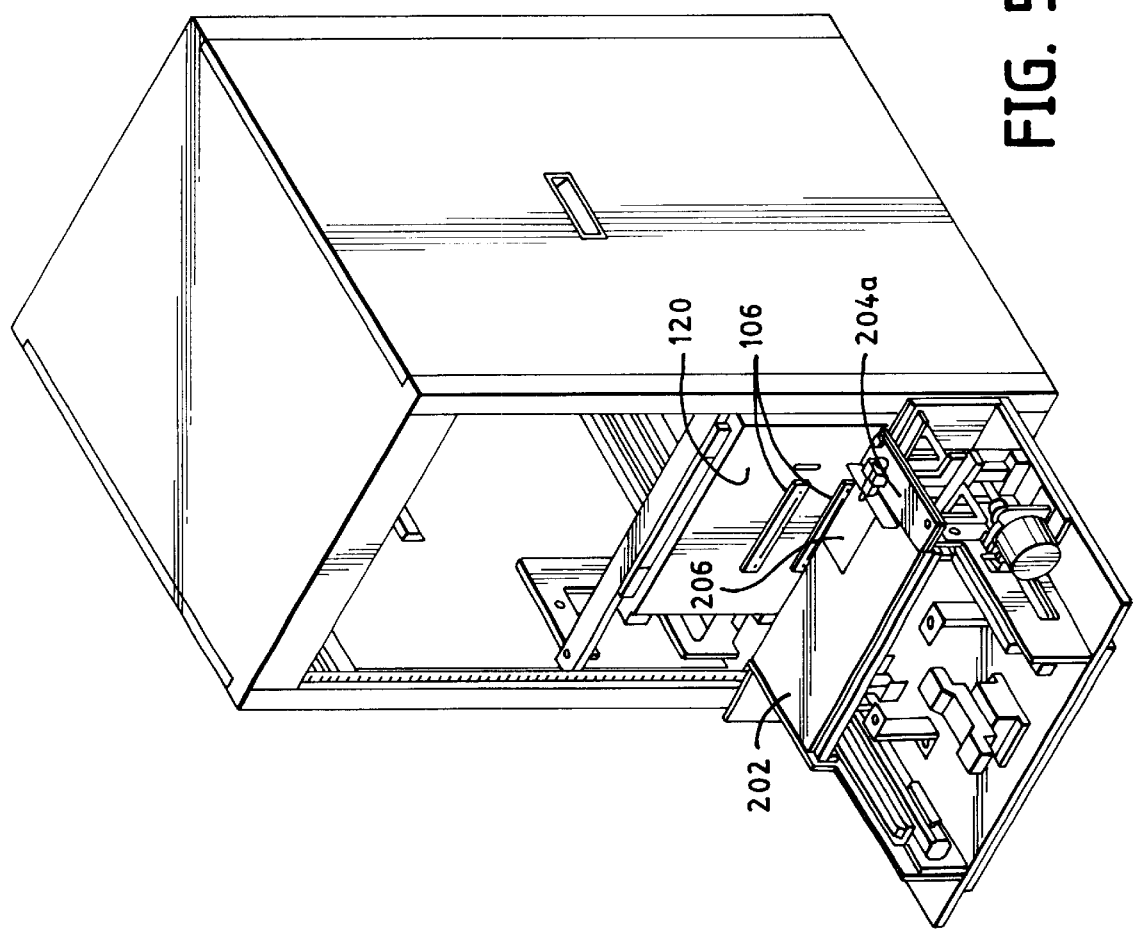
FIG. 5 illustrates the device under test in actual test position.
Figure 6:
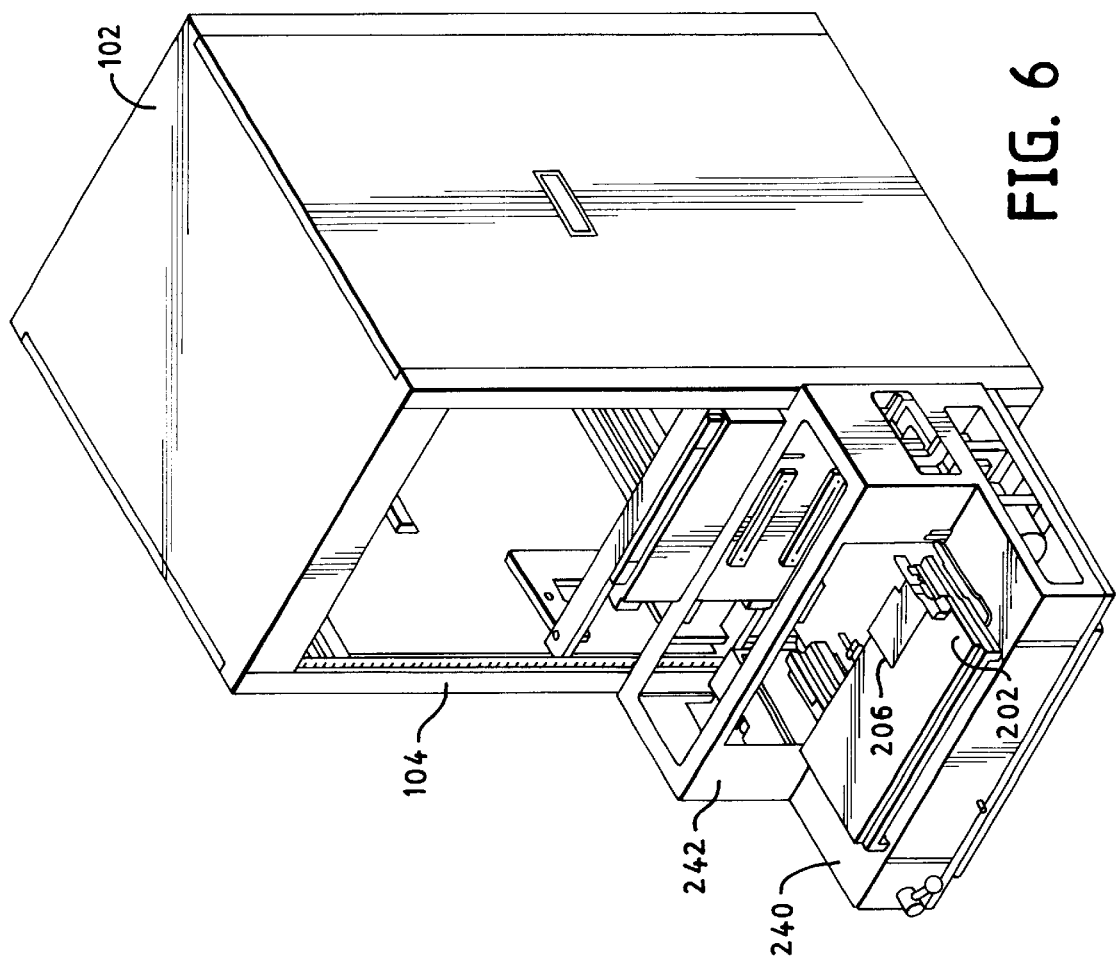
FIG. 6 illustrates the test fixture with a cover.

Referring to FIG. 5, the pallet is shown in an engaged position. Note that the device under test is directly engaged to the interface module 106. A second interface is also shown. A second pallet could be attached to the test fixture to allow for the testing of two devices simultaneously. Note that the device under test has engaged the interface . module 106 and the plug 204a has engaged the device under test. FIG. 6 shows the test fixture protected by a cover. As expected, due to the number of moving elements, it is important to protect operators of the tester from accidental injury. A first and second cover 240, 242 can be used to shield many of the moving elements.

The description of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application and to enable others of ordinary skill in the art to understand the invention for various embodiments with various modifications as are suited to the particular use contemplated

What is claimed is:

1. An apparatus for testing a functionality of a device under test (DUT), comprising:
    a test enclosure;
    a test fixture coupled to the test enclosure:
    a personality board coupled to the test enclosure, the personality board having at least one interface;
    a drawer assembly configured to mount the DUT to the test fixture and to move the DUT between an engaged and a disengaged position with the at least one interface; and
    a module configured to laterally engage into the DUT when the DUT is in the engaged position with the at least one interface.

2. The apparatus of claim 1, wherein the module comprises a plate.

3. The apparatus of claim 2, wherein the module further comprises:
    an actuator configured to laterally move the plate into the DUT.

4. The apparatus of claim 3, wherein the actuator comprises a pneumatic actuator.

5. The apparatus of claim 3, wherein the actuator comprises a servo actuator.

6. The apparatus of claim 3, wherein the actuator comprises a handcrank.

7. The apparatus of claim 2, further comprising:
    a test connection coupled to the plate, wherein the module laterally engages the test connection into the DUT.

8. The apparatus of claim 3, further comprising:
    a test connection coupled to the plate, wherein the actuator laterally engages the test connection into the DUT.

9. The apparatus of claim 8, wherein the test connection comprises a plug.

10. The apparatus of claim 9, wherein the plug engages into a port of the DUT.

11. The apparatus of claim 10, wherein the DUT comprises a printed circuit board assembly.

12. The apparatus of claim 11, wherein the printed circuit board assembly comprises a modem.

13. The apparatus of claim 12, wherein the pots comprises a telephone poi-t of the modem.

14. The apparatus of claim 1, further comprising:
    a pallet coupled to the drawer assembly, the pallet configured to couple the DUT to the drawer assembly.

15. The apparatus of claim 14, the pallet further comprising: registration means for engaging the DUT.

16. The apparatus of claim 7, wherein the test enclosure comprises at least one test equipment.

17. The apparatus of claim 16, wherein the test connection couples to the at least one test equipment.

18. .The apparatus of claim 14, wherein the pallet comprises non-conductive material.

19. The apparatus of claim 1, wherein the test enclosure comprises at least one test equipment.

20. The apparatus of claim 19, wherein the at least one interface couples to the at least one test equipment.

21. The apparatus of claim 1, wherein the test fixture comprises:

a base plate coupled to the test enclosure;

first and second side walls coupled to the base plate, the first and second side walls comprising first and second end portions, respectively;

at least one end plate coupled to the base plate and the first and second end portions, wherein the drawer assembly couples to the first and second side walls.

22. A method of testing a functionality of a device under test (DUT), comprising:

placing the DUT on a pallet mounted on a movable drawer assembly;

moving the pallet and the DUT into engagement with at least one interface of a modular personality board;

laterally engaging a test connection into the DUT when the DUT is engaged with the at least one interface; and testing the functionality of the DUT.

23. The method of claim 22, wherein the test connection comprises a plug.

24. The method of claim 23, wherein the plug engages into a port of the DUT.

25. The method of claim 24, wherein the DUT comprises a printed circuit board assembly.

26. The method of claim 25, wherein the printed circuit board assembly comprises a modem.

27. The method of claim 26, wherein the port comprises a telephone port of the modem.

28. The method of claim 22, wherein the test connection couples to at least one test equipment.

29. The method of claim 22, wherein testing the functionality of the DUT comprises:

testing the functionality via a port of the DUT.

30. The method of claim 22, wherein testing the functionality of the DUT comprises:

testing the functionality via the at least one interface.

* * * * *